United States Patent
Kogure (10) Patent No.: US 9,099,513 B2
(45) Date of Patent: Aug. 4, 2015

(54) SUBSTRATE PROCESSING APPARATUS, AND SUBSTRATE PROCESSING METHOD

(75) Inventor: Kimio Kogure, Kanagawa-ken (JP)

(73) Assignee: SHIBAURA MECHATRONICS CORPORATION, Yokohama-Shi (JP)

( * ) Notice: Subject to any disclaimer, the term of this patent is extended or adjusted under 35 U.S.C. 154(b) by 1184 days.

(21) Appl. No.: 13/062,740

(22) PCT Filed: Sep. 1, 2009

(86) PCT No.: PCT/JP2009/065233
§ 371 (c)(1),
(2), (4) Date: Mar. 8, 2011

(87) PCT Pub. No.: WO2010/026955
PCT Pub. Date: Mar. 11, 2010

(65) Prior Publication Data
US 2011/0159200 A1 Jun. 30, 2011

(30) Foreign Application Priority Data
Sep. 8, 2008 (JP) .................................. 2008-229484

(51) Int. Cl.
B05D 1/04 (2006.01)
B05C 13/02 (2006.01)
H01L 21/687 (2006.01)
(Continued)

(52) U.S. Cl.
CPC ........ *H01L 21/68721* (2013.01); *C23C 14/042* (2013.01); *C23C 14/50* (2013.01); *H01L 21/68735* (2013.01)

(58) Field of Classification Search
USPC .................. 118/730, 345.55, 500, 721, 728; 156/345.51
See application file for complete search history.

(56) References Cited

U.S. PATENT DOCUMENTS 5,985,033 A * 11/1999 Yudovsky et al. ............. 118/715
6,063,440 A *  5/2000 Chen et al. .................. 427/248.1
(Continued)

FOREIGN PATENT DOCUMENTS

JP     07-335616 A    12/1995
JP    2003-059998 A    2/2003
(Continued)

OTHER PUBLICATIONS

Machine Generated English Translation of JP 2008-047841 published Feb. 28, 2008.*
(Continued)

*Primary Examiner* — Sylvia R MacArthur
(74) *Attorney, Agent, or Firm* — Pearne & Gordon LLP (57) ABSTRACT

A substrate processing apparatus includes a tray, a mask and a rotary stage. The tray includes a substrate support configured to support an outer edge portion of a substrate, a mask support provided on an outer periphery side of the substrate support and projected above the substrate support, and a recess provided between the substrate support and the mask support. The mask covers the recess and the substrate support of the tray. The rotary stage includes an electrostatic adsorption surface and a tray mounting portion provided on an outer periphery side of the electrostatic adsorption surface and below the electrostatic adsorption surface. The outer edge portion of the substrate is projected toward the tray mounting portion side from the electrostatic adsorption surface. The substrate support is spaced below the outer edge portion of the substrate. The mask is spaced above the outer edge portion of the substrate.

6 Claims, 5 Drawing Sheets

(51) Int. Cl.
*C23C 14/04* (2006.01)
*C23C 14/50* (2006.01)

(56) References Cited

U.S. PATENT DOCUMENTS

| | | | |
|---|---|---|---|
| 2006/0075972 A1* | 4/2006 | Nakashima et al. | 118/729 |
| 2006/0272561 A1* | 12/2006 | Chang et al. | 111/183 |
| 2011/0159200 A1* | 6/2011 | Kogure | 427/458 |

FOREIGN PATENT DOCUMENTS

| | | | |
|---|---|---|---|
| JP | 2004-022571 A | | 1/2004 |
| JP | 2008-047841 | * | 2/2008 |
| JP | 2008-047841 A | | 2/2008 |

OTHER PUBLICATIONS

International Search Report for PCT/JP2009/065233 dared Nov. 17, 2009.

* cited by examiner

SUBSTRATE PROCESSING APPARATUS, AND SUBSTRATE PROCESSING METHOD

TECHNICAL FIELD

This invention relates to a substrate processing apparatus and a substrate processing method particularly suitable to process a substrate having a thin thickness.

BACKGROUND ART

In substrate processing, such processes as thin film formation, surface modification, and dry etching are performed on a substrate in a vacuum. Such substrate processing is often performed with the substrate placed on a tray. For instance, in the processing disclosed in Patent Document 1, a substrate is dropped into the recess of a bottomed tray, and a ring chuck is further placed thereon. In this state, the substrate along with the tray is electrostatically adsorbed onto an electrostatic chuck and processed.

PRIOR ART DOCUMENT

Patent Document

[Patent Document 1] JP-A 2003-59998

DISCLOSURE OF INVENTION

Technical Problem

The substrate to be processed can be a semiconductor wafer having a very thin thickness. Particularly in this case, the wafer outer edge portion is prone to breakage due to contact between the wafer outer edge portion and the tray. Here, there is concern about the following problems. If the fragment of the wafer is placed on the transfer hand or the electrostatic chuck, the fragment is sandwiched between it and the wafer. This may cause damage to the device formation surface of the wafer or cause fracture in the wafer. If the surface of the electrostatic chuck is made of a flexible material such as polyimide, the fragment digs into it and reaches the electrostatic chucking electrode, causing short circuit.

This invention has been made in view of the above problems. This invention provides a substrate processing apparatus and a substrate processing method capable of avoiding trouble resulting from substrate fragments.

Technical Solution

According to one aspect of the invention, there is provided a substrate processing apparatus including: a ring-shaped tray including a substrate support configured to support an outer edge portion of a substrate, a mask support provided on an outer periphery side of the substrate support and projected above the substrate support, and a recess provided between the substrate support and the mask support; a ring-shaped mask covering the recess and the substrate support of the tray with the mask being superposed on the mask support of the tray; and a rotary stage including an electrostatic adsorption surface and a tray mounting portion provided on an outer periphery side of the electrostatic adsorption surface and below the electrostatic adsorption surface, the outer edge portion of the substrate being projected toward the tray mounting portion side from the electrostatic adsorption surface, the substrate support being spaced below the outer edge portion of the substrate and the mask being spaced above the outer edge portion of the substrate with the substrate being adsorbed onto the electrostatic adsorption surface and the tray mounted on the tray mounting portion.

According to another aspect of the invention, there is provides a substrate processing method including: transferring a ring-shaped tray and a ring-shaped mask toward a rotary stage, the tray including a substrate support and a mask support provided on an outer periphery side of the substrate support and projected above the substrate support, an outer edge portion of a substrate being supported on the substrate support, the mask being superposed on the mask support and covering the outer edge portion of the substrate, the rotary stage including an electrostatic adsorption surface and a tray mounting portion provided on an outer periphery side of the electrostatic adsorption surface and below the electrostatic adsorption surface; processing on the substrate while rotating the rotary stage with the substrate being adsorbed onto the electrostatic adsorption surface, the tray being mounted on the tray mounting portion, the substrate support being spaced below the outer edge portion projected toward the tray mounting portion side from the electrostatic adsorption surface and the mask being spaced above the outer edge portion; and after the processing of the substrate, canceling an electrostatic adsorption force acting on the substrate while maintain a state where the tray is mounted on the tray mounting portion and the mask is superposed on the mask support.

This invention can provide a substrate processing apparatus and a substrate processing method capable of avoiding trouble resulting from substrate fragments.

BEST MODE FOR CARRYING OUT THE INVENTION

Embodiments of the invention will now be described with reference to the drawings. In an embodiment of the invention, a specific example is described in which a semiconductor wafer is taken as an example of the substrate to be processed and sputter film formation processing is performed on the semiconductor wafer.

The semiconductor wafer to be processed in this embodiment is very thin. For instance, the thickness is 10 to 100 μm and more particularly about 50 μm. In this embodiment, such a thin semiconductor wafer is transferred into and out of a processing chamber in the state of being held by a holding member.

Figure 1:
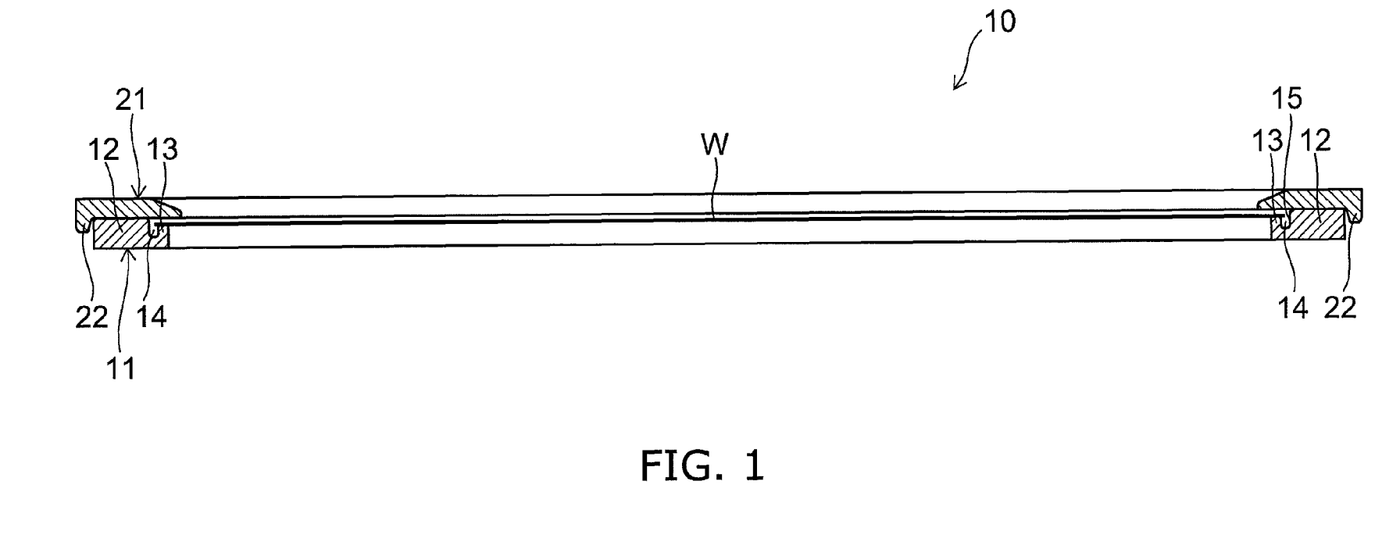
FIG. 1 is a schematic cross-sectional view of a substrate holding according to an embodiment of the invention.

FIG. 1 is a schematic cross-sectional view of the holding member 10. FIG. 1 also shows a semiconductor wafer W held by the holding member 10.

The holding member 10 is composed of a ring-shaped tray 11 and a ring-shaped mask 21. The tray 11 and the mask 21 are transferred into the processing chamber along with the semiconductor wafer W and exposed to plasma, high temperature, and various gases during sputter film formation processing. However, the tray 11 and the mask 21 have heat resistance and mechanical strength enough to endure them and can stably hold the semiconductor wafer W without deformation or breakage. For instance, the tray 11 and the mask 21 can be made of a material such as titanium, titanium alloy, and alumina.

The tray 11 is formed like a circular ring. The outer diameter of the tray 11 is larger than the diameter of the semiconductor wafer W. The inner diameter of the tray 11 is smaller than the diameter of the semiconductor wafer W. On the upper surface side of the tray 11 where the semiconductor wafer W is to be held, a step difference is provided. The lower surface on a side opposite thereto is a flat surface.

On the upper surface side of the tray 11, a wafer support (substrate support) 13 and a mask support 12 are provided. The mask support 12 is provided on the outer periphery side of the tray 11, which is larger than the diameter of the semiconductor wafer W. On the inner periphery side of this mask support 12, the wafer support 13 is provided.

The upper surface of the wafer support 13 is formed like a circular ring in conformity with the circular shape of the semiconductor wafer W. The upper surface of the mask support 12 is also formed like a circular ring. The radial width dimension of the mask support 12 is larger than the radial width dimension of the wafer support 13. Hence, the area of the upper surface of the mask support 12 is larger than the area of the upper surface of the wafer support 13.

The mask support 12 is projected above the wafer support 13. Here, the term "above" is used in contrast to the term "below", which refers to the side of the flat rear surface of the tray 11. Hence, there is a difference in height (step difference) between the upper surface of the mask support 12 and the upper surface of the wafer support 13. The upper surface of the mask support 12 is located above the upper surface of the wafer support 13.

A recess 14 is provided in tray 11 between the wafer support 13 and the mask support 12. The recess 14 is formed like a continuous trench throughout the periphery of the ring-shaped tray 11 so as to extend along the curvature of the outer edge of the semiconductor wafer W. The bottom of the recess 14 is located below the upper surface of the mask support 12 and the upper surface of the wafer support 13.

The outer edge portion (peripheral portion) of the semiconductor wafer W is mounted on the wafer support 13 of the tray 11, and thereby the semiconductor wafer W is supported on the tray 11. The diameter of the semiconductor wafer W is e.g. 200 mm. The portion of the semiconductor wafer W supported in contact with the wafer support 13 is a portion of approximately 2.5 mm on the outer periphery side.

The inner diameter of the mask support 12 is slightly larger than the diameter of the semiconductor wafer W. The semiconductor wafer W is housed inside the inner peripheral surface 15 of the mask support 12. The radial misalignment of the semiconductor wafer W is restricted by the inner peripheral surface 15 of the mask support 12.

The mask 21 constitutes the holding member 10 in conjunction with the aforementioned tray 11. The mask 21 is formed like a circular ring. The outer diameter of the mask 21 is larger than the outer diameter of the tray 11. The inner diameter of the mask 21 is smaller than the inner diameter of the tray 11. That is, the radial width dimension of the mask 21 is larger than the radial width dimension of the tray 11. In a state where part of the lower surface of the mask 21 is mounted on the mask support 12 of the tray 11 and superposed on the tray 11, the mask 21 covers the entire tray 11. Both the lower surface and upper surface of the mask 21 are flat surfaces. The lower surface extends radially more inward than the tray 11.

A rib 22 projected downward and shaped like a circular ring is provided in the outermost peripheral portion of the mask 21. The tray 11 is housed on the inner peripheral side of this rib 22, so that the radial misalignment between the tray 11 and the mask 21 is restricted. The circular ring-shaped rib 22 thus formed suppresses deformation of the mask 21. In the tray 11, the circular ring-shaped recess 14 formed therein suppresses deformation of the tray 11. However, the main function of the recess 14 is, as described below, to trap fragments resulting from breakage, if any, of the outer edge portion of the semiconductor wafer W so that the fragments are not moved to the rear side of the semiconductor wafer W.

In this embodiment, a metal film (where the metal is not limited to pure metal, but also includes alloys) functioning as an electrode is formed by the sputtering method on a second major surface of the semiconductor wafer W on a side opposite to a first major surface. The device main portion such as transistors is formed on the first major surface. With the second major surface, i.e., the film formation surface of the semiconductor wafer W, facing up, the outer edge portion of the semiconductor wafer W is mounted and supported on the wafer support 13 of the tray 11. The semiconductor wafer W is placed on the wafer support 13 of the tray 11 under its own weight.

The mask 21 is superposed on the mask support 12 of the tray 11. The mask 21 is mounted on the mask support 12 of the tray 11 under its own weight. With the mask 21 superposed on the mask support 12, the mask 21 covers the entire tray 11 including the wafer support 13, the recess 14, and the mask support 12. In the case where the semiconductor wafer W is supported on the tray 11, the mask 21 covers the outer edge portion of the semiconductor wafer W. At this time, the upper surface of the wafer support 13 is located at a lower position than the upper surface of the mask support 12. Hence, a small gap is formed between the film formation surface of the semiconductor wafer W and the lower surface of the mask 21. Thus, the mask 21 is not in contact with the semiconductor wafer W.

In the state of being held by the tray 11 and the mask 21 as shown in FIG. 1, the semiconductor wafer W is transferred into the processing chamber, or transferred out of the processing chamber after processing. According to this embodiment, a thin semiconductor wafer W is placed on the tray 11 having sufficient strength and transferred along with the tray 11. Thus, for instance, the lift mechanism, which vertically moves the semiconductor wafer W with respect to the stage in the processing chamber, is not in contact with the semiconductor wafer W. This can prevent the semiconductor wafer W from being scratched. Furthermore, breakage of the semiconductor wafer W can be prevented by damping the impact thereon.

Furthermore, in this embodiment, the mask 21 is superposed on the tray 11 so that the outer edge portion of the semiconductor wafer W is covered with the mask 21. This can prevent the semiconductor wafer W from jumping or dropping from the tray 11 during transfer.

The processing apparatus according to this embodiment is a mufti-chamber processing apparatus including a plurality of processing chambers so that film formation of a plurality of stacked films of different types, or film formation of a specific type, can be performed on a substrate. In each processing chamber, sputter film formation processing, for instance, is performed on the substrate. Besides the processing chambers, the mufti-chamber processing apparatus according to this embodiment also includes a substrate exchange chamber. This substrate exchange chamber includes a transfer robot 50 shown in FIGS. 3A and 3B.

Figure 3A:
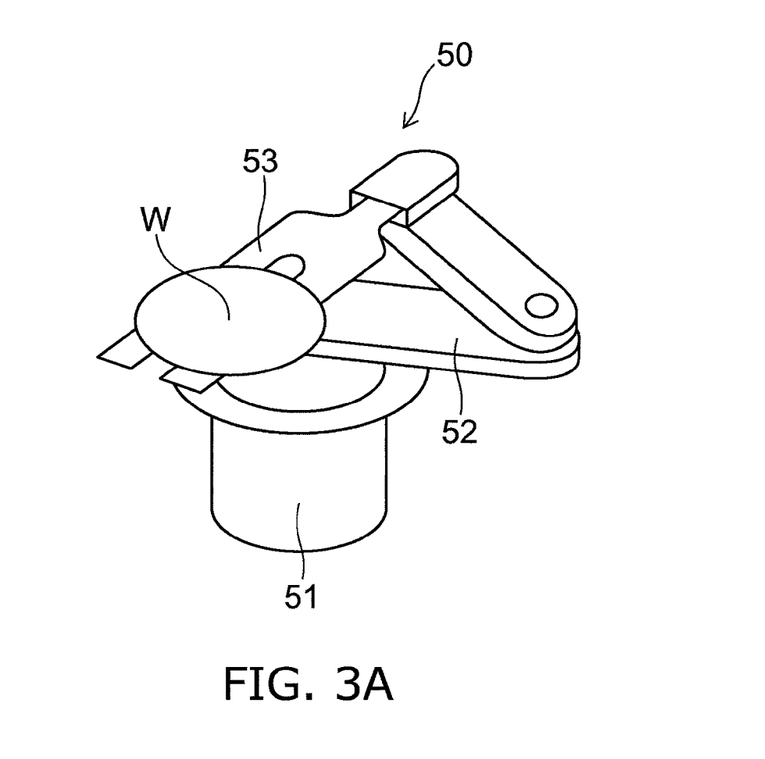
FIGS. 3A and 3B are schematic perspective views of a transfer robot.
Figure 3B:
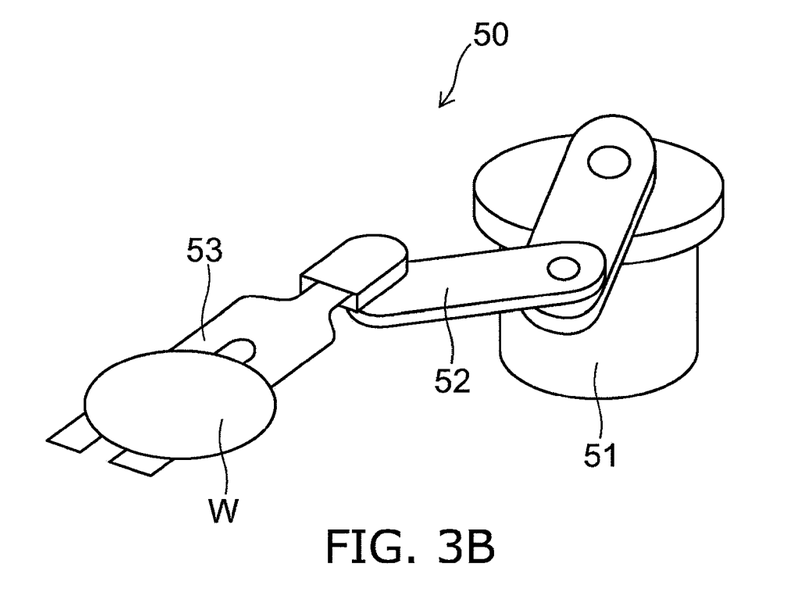

This transfer robot 50 is a horizontal multijoint robot in which an arm 52 is horizontally moved by a driving mechanism 51. In the substrate exchange chamber, an unprocessed semiconductor wafer W is taken out of a cassette, not shown, by the transfer robot 50 onto fingers (hand) 53 attached to the tip of the arm 52. Conversely, the processed semiconductor wafer W is returned from the fingers 53 into the cassette. The semiconductor wafer W is placed on the fingers 53 only under its own weight and is not subjected to holding such as adsorption. The holding force is only the frictional force generated by the self-weight in the area where the semiconductor wafer W is in contact with the fingers 53.

A thin semiconductor wafer W has a light weight. Hence, in the transfer method using frictional resistance as in the aforementioned transfer robot 50, large frictional resistance cannot be expected, and it is difficult to increase the transfer speed. In contrast, the tray 11 and the mask 21 have sufficiently larger weight than the semiconductor wafer W. By placing the semiconductor wafer W on the fingers 53 along with the tray 11 and the mask 21 and transferring them together, the frictional resistance is increased. Thus, the transfer speed can be increased, and the total processing time can be reduced.

Figure 2:
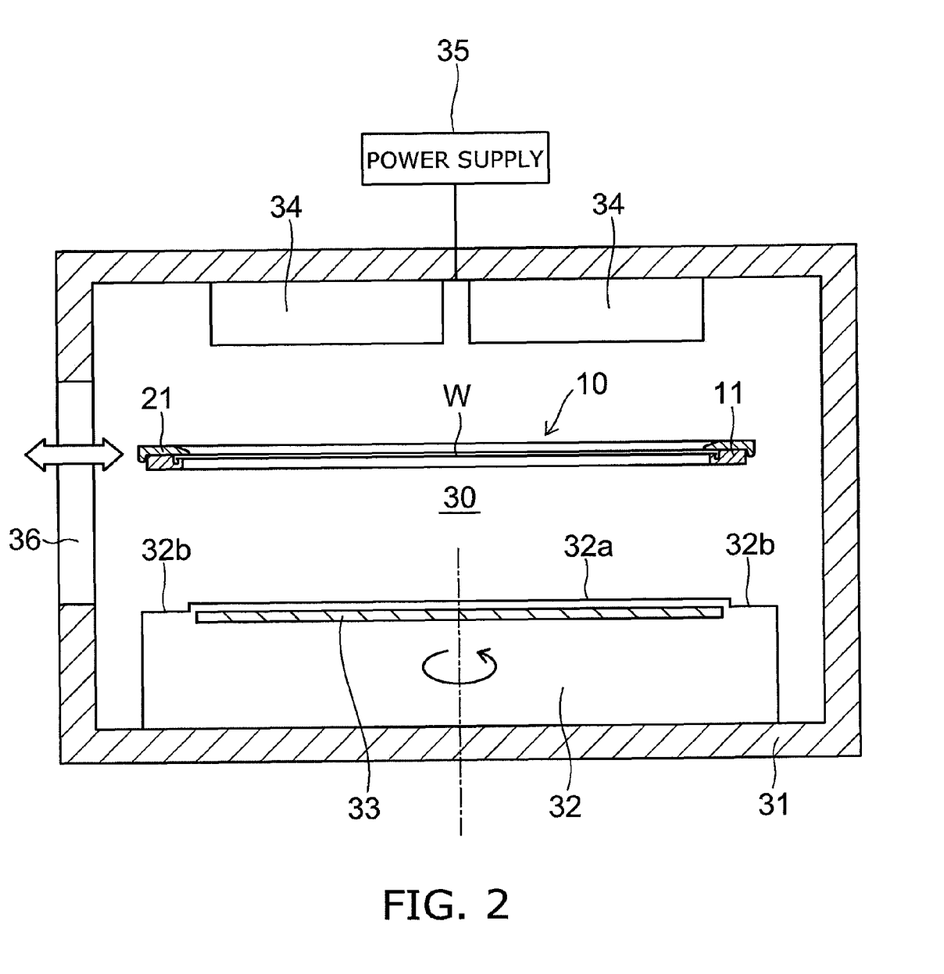
FIG. 2 is a schematic view of a substrate processing apparatus according to the embodiment of the invention.

FIG. 2 schematically shows one processing chamber in the processing apparatus according to the embodiment of the invention.

The processing chamber 30 is enclosed by a chamber wall 31. A gas introduction system and an exhaust system, not shown, are connected into the processing chamber 30. By controlling them, the processing chamber 30 can be filled with a desired gas under a desired reduced pressure.

In the processing chamber 30, a target 34 and a rotary stage 32 are provided oppositely. The target 34 is held by e.g. a backing plate and provided at the top in the processing chamber 30. The rotary stage 32 is provided at the bottom in the processing chamber 30.

The rotary stage 32 includes an electrostatic chuck mechanism. An electrode 33 is provided therein. Between the electrode 33 and the stage surface (electrostatic adsorption surface 32*a*), a dielectric is provided. When the internal electrode 33 is applied with a voltage from a power supply, not shown, an electrostatic force is generated between the electrostatic adsorption surface 32*a* and the semiconductor wafer W mounted thereon. Thus, the semiconductor wafer W is adsorbed and fixed to the electrostatic adsorption surface 32*a*.

The rotary stage 32 includes a tray mounting portion 32*b* at a position on the outer periphery side of the electrostatic adsorption surface 32*a* and below the electrostatic adsorption surface 32*a*. The tray mounting portion 32*b* is annularly provided so as to surround the periphery of the electrostatic adsorption surface 32*a*.

As described above, the processing apparatus of this embodiment is a mufti-chamber processing apparatus including a plurality of processing chambers. To suppress the number of processing chambers to downsize the overall apparatus, for instance, two targets 34 having a small diameter are used to share the processing chamber. Thus, for uniform film formation on the entire film formation surface of the semiconductor wafer W, sputter film formation is performed while rotating the semiconductor wafer W by the rotary stage 32.

The rotary stage 32 is provided so as to be rotatable along with the internal electrode 33 about the central axis indicated by the dot-dashed line in FIG. 2.

The semiconductor wafer W in the state shown in FIG. 1 is transferred into the processing chamber 30 through a transfer port 36 formed in the chamber wall 31 along with the holding member 10 (tray 11 and mask 21). After this transfer-in, the transfer port 36 is hermetically closed by e.g. a gate, not shown. Subsequently, the processing chamber 30 is filled with a desired gas atmosphere at a desired pressure suitable for sputter film formation processing.

Figure 4:
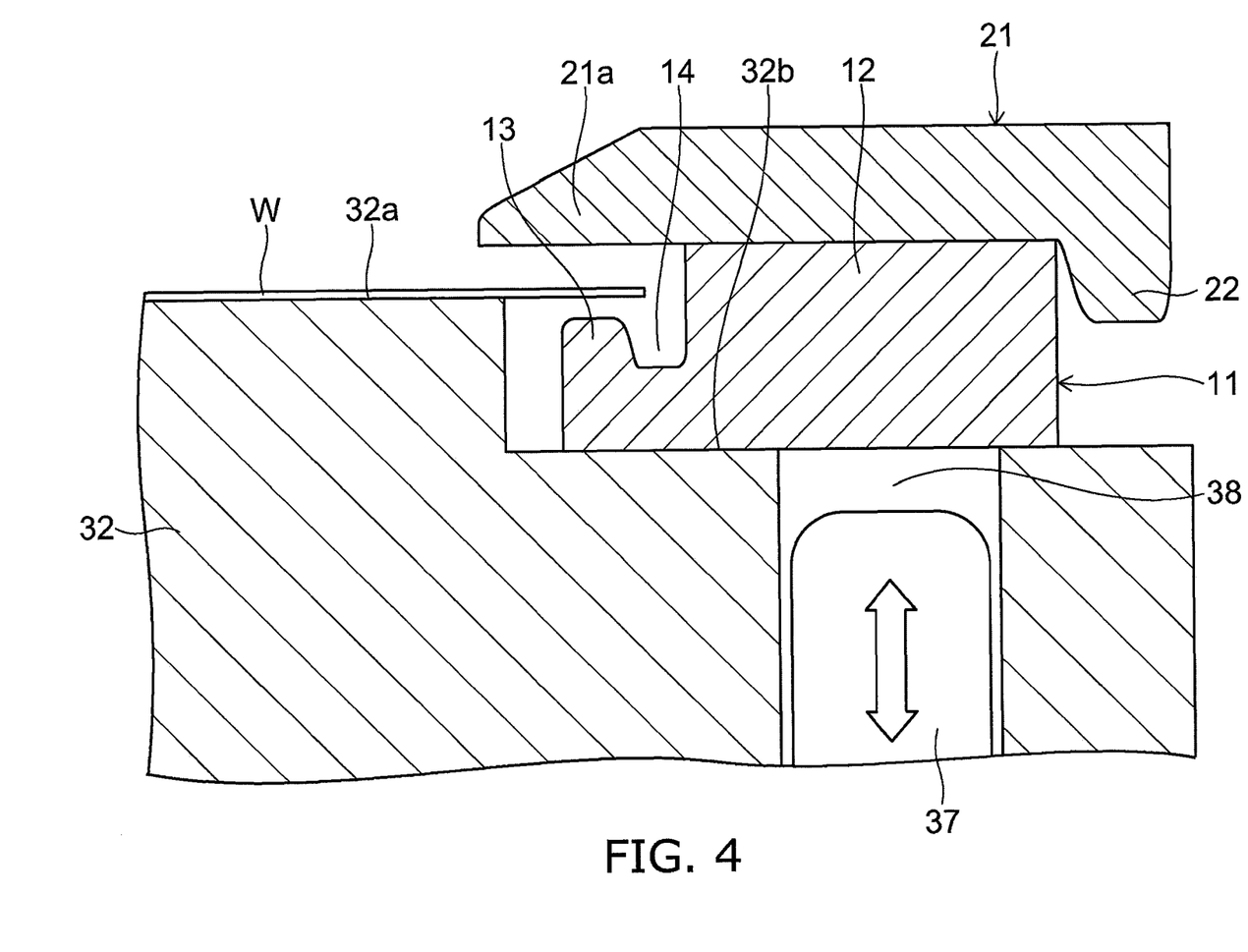
FIG. 4 is a relevant part enlarged schematic view illustrating a state where a substrate is electrostatically adsorbed onto an electrostatic adsorption surface of a rotary stage and a tray is mounted on a tray mounting portion of the rotary stage in a substrate processing method according to the embodiment of the invention.

Transfer of the holding member 10 into/out of the processing chamber 30 through the transfer port 36 is performed by e.g. a transfer robot. In the processing chamber 30, a lift mechanism 37 shaped like a pin, for instance, as shown in FIG. 4 is provided. The lower surface of the tray 11 is supported on the lift mechanism 37. The lift mechanism 37 is provided so as to be vertically movable in a guide hole 38 formed below the tray mounting portion 32*b* of the rotary stage 32 and in the space above the guide hole 38. Here, the lift mechanism 37 is not limited to the pin shape, but may be shaped like a table.

The holding member 10 holding the semiconductor wafer W is transferred into a position above the rotary stage 32 as shown in FIG. 2. Subsequently, by lowering the lift mechanism 37 supporting the lower surface of the holding member 10, the holding member 10 is lowered toward the rotary stage 32.

The electrostatic adsorption surface 32*a* is formed in a circular shape, for instance. The inner diameter of the tray 11 is larger than the diameter of the electrostatic adsorption surface 32*a*, so that the electrostatic adsorption surface 32*a* can be housed inside the inner peripheral surface of the tray 11.

With the lowering of the tray 11, the semiconductor wafer W supported on the wafer support 13 of the tray 11 is also lowered. When the tray 11 is lowered below the electrostatic adsorption surface 32*a*, the lower surface of the semiconductor wafer W exposed from the tray 11 is mounted on the electrostatic adsorption surface 32*a*, and adsorbed and fixed thereto. The outer edge portion of the semiconductor wafer W, which has been supported on the wafer support 13 of the tray 11, is projected toward the tray mounting portion 32*b* side on the outer periphery side of the electrostatic adsorption surface 32*a* as shown in FIG. 4.

The tray 11 is mounted on the tray mounting portion 32*b* of the rotary stage 32. As shown in FIG. 4, in a state where the tray 11 is mounted on the tray mounting portion 32*b*, the upper surface of the wafer support 13 is located below the electrostatic adsorption surface 32*a* and spaced from the outer edge portion of the semiconductor wafer W without contact therewith.

With the lowering of the tray 11, the mask 21 supported on the mask support 12 of the tray 11 is also lowered. From when the semiconductor wafer W is placed on the wafer support 13 of the tray 11, the inner peripheral portion 21*a* of the mask 21 covers the outer edge portion of the semiconductor wafer W. By suitably setting the step difference between the wafer support 13 and the mask support 12 in the tray 11, even when the tray 11 is disengaged from supporting the semiconductor wafer W and mounted on the tray mounting portion 32*b*, the inner peripheral portion 21*a* of the mask 21 can maintain the state of being spaced from the outer edge portion of the semiconductor wafer W without contact therewith.

In this state shown in FIG. 4, while the rotary stage 32 is rotated, sputter film formation processing is performed on the semiconductor wafer W. More specifically, a voltage is applied from a power supply 35 shown in FIG. 2 to the target 34 to cause electrical discharge between the target 34 and the rotary stage 32 to generate plasma. Ions resulting therefrom are accelerated toward the target 34 by the electric field in the processing space and impinge on the target 34. Thus, particles of the target material are sputtered from the target 34, and attached and deposited on the film formation surface of the semiconductor wafer W.

According to this embodiment, during transfer with the semiconductor wafer W held by the holding member 10 and during processing shown in FIG. 4, the recess 14 is located below the outer edge portion of the semiconductor wafer W. Hence, even if the outer edge portion of a thin semiconductor wafer W interferes with the tray 11 and generates fine fragments, the fragments can be dropped and trapped in the recess 14. That is, the fragments are not scattered. This can avoid causing the fragments of the semiconductor wafer W to be moved to the lower surface side of the semiconductor wafer W and sandwiched between the semiconductor wafer W and the finger 53 of the transfer robot 50 or the electrostatic adsorption surface 32a. Hence, it is possible to prevent trouble such as damage to the device formation surface of the semiconductor wafer W and short circuit due to digging of the fragment into the internal electrode 33 of the rotary stage 32.

Furthermore, during processing, the mask 21 covers the entire tray 11 including the recess 14 and the wafer support 13. Hence, film attachment to the tray 11 is prevented, and maintenance effort can be reduced.

After the sputter film formation processing is completed, while the state shown in FIG. 4 is maintained, voltage application to the internal electrode 33 shown in FIG. 2 is first stopped to cancel the electrostatic adsorption force acting on the semiconductor wafer W. At this time, the inner peripheral portion 21a of the mask 21 covers the outer edge portion of the semiconductor wafer W. This can prevent the semiconductor wafer W from jumping on the rotary stage 32 or dropping from the rotary stage 32.

After the semiconductor wafer W is disengaged from adsorption and fixation, the tray 11 is raised from the state of FIG. 4 by the rising of the lift mechanism 37. The outer edge portion of the semiconductor wafer W is placed on the wafer support 13 of the tray 11, and the semiconductor wafer W is lifted up from the electrostatic adsorption surface 32a. Then, the transfer port 36 shown in FIG. 2 is opened, and the semiconductor wafer W is transferred out of the processing chamber 30 along with the holding member 10 by a transfer mechanism, not shown.

During processing while rotating the rotary stage 32, the semiconductor wafer W is fixed to the electrostatic adsorption surface 32a. However, the tray 11 is simply placed on the tray mounting portion 32b of the rotary stage 32. Furthermore, the mask 21 is also simply placed on the mask support 12 of the tray 11. Hence, during rotation of the rotary stage 32, the tray and the mask 21 may be displaced relative to the semiconductor wafer W by the inertial force. If the tray 11 is fixed to the rotary stage 32, or if the tray 11 and the mask 21 are fixed to each other, such displacement can be eliminated. However, this tends to complicate the configuration because of the mechanism involving rotation.

Thus, in this embodiment, while allowing the displacement of the tray 11 and the mask 21 due to rotation of the rotary stage 32, the tray 11 and the mask 21 placed on the rotary stage 32 are both prevented from being in contact with the semiconductor wafer W as shown in FIG. 4. Thus, the influence of any displacement of the tray 11 and the mask 21 is not exerted on the semiconductor wafer W. For a thin semiconductor wafer W, even slight contact with the tray 11 or the mask 21 is likely to lead to breakage. However, in this embodiment, as described above, the tray 11 and the mask 21 are spaced from the semiconductor wafer W. This can prevent breakage of the semiconductor wafer W. Furthermore, even if the tray 11 or the mask 21 is brought into contact with the outer edge portion of the semiconductor wafer W and breaks the outer edge portion, the fragments can be dropped and trapped in the recess 14 of the tray 11 as described above. Hence, trouble resulting from the fragments can be avoided.

Figure 5A:
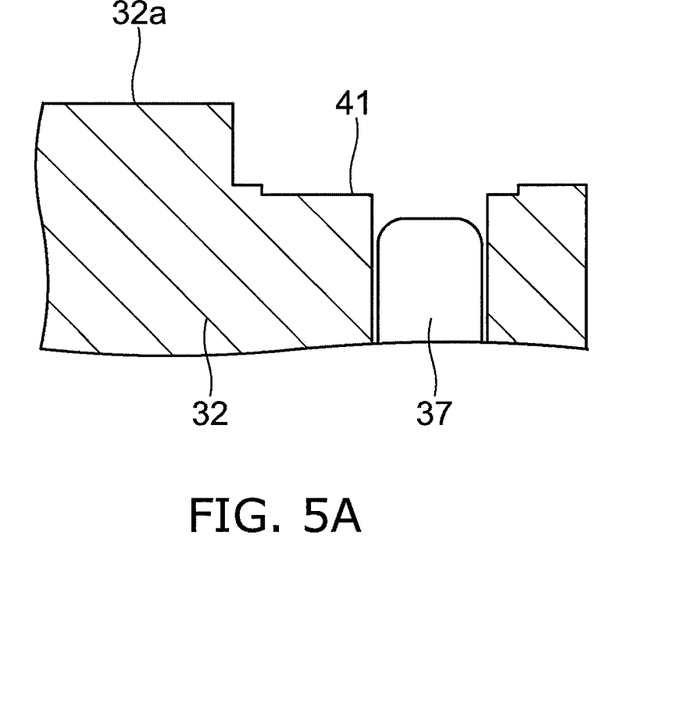
FIGS. 5A and 5B are schematic views illustrating other specific examples of the tray mounting portion on the rotary stage illustrated in FIG. 2 and FIG. 4.
Figure 5B:
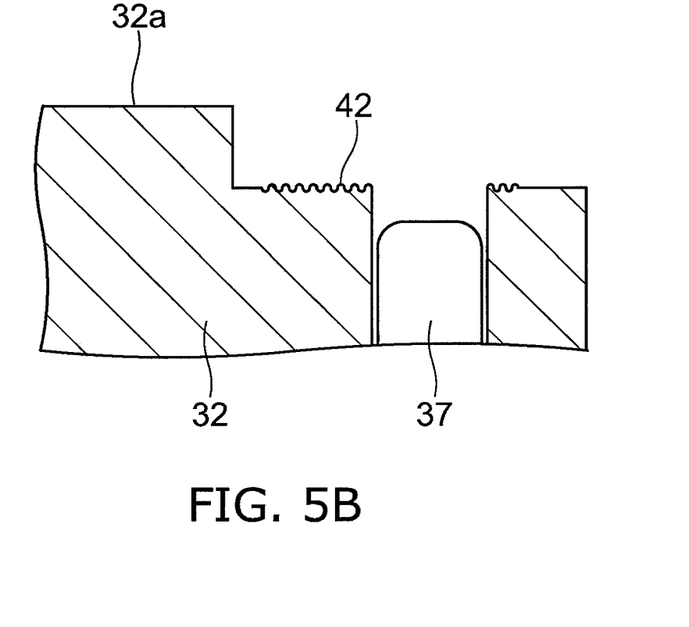

In addition, the tray mounting portion 32b may be provided with a restriction mechanism for restricting the sliding motion of the tray 11 associated with the rotation of the rotary stage 32. For instance, FIG. 5A shows an example of providing a trench 41 capable of housing the lower surface of the tray 11. In this case, the radial motion of the tray 11 can be restricted by the sidewall of the trench 41. Furthermore, FIG. 5B shows an example of providing a fine corrugation 42 on the surface of the tray mounting portion. Alternatively, the surface of the tray mounting portion may be roughened. In this case, the tray 11 can be made less prone to sliding motion by increasing the frictional force between the surface of the tray mounting portion and the lower surface of the tray mounted thereon.

It is noted that in the configuration of Patent Document 1, the rear surface of the tray is adsorbed on the electrostatic adsorption surface. In contrast, in this embodiment, the semiconductor wafer W is directly adsorbed on the electrostatic suction surface 32a. Hence, according to this embodiment, for instance, in the case where the semiconductor wafer is heated by a heater built in the stage, heat conduction from the stage to the wafer is not blocked because the tray is not interposed between the stage and the semiconductor wafer. Thus, the semiconductor wafer can be set to a desired temperature with good controllability of heating or cooling. Furthermore, the degree of contact between the wafer and the adsorption surface can be made uniform throughout the wafer without variation, and the temperature distribution in the wafer surface can also be made uniform. For these reasons, the quality of wafer processing can be improved. Furthermore, in the case of electrostatically adsorbing the tray, the tray is limited to insulators. However, in this embodiment, the material of the tray is not limited to insulators. The tray is not limited in the choice of materials.

Embodiments of the invention have been described above with reference to specific examples. However, the invention is not limited thereto. Various modifications can be made within the spirit of the invention.

The substrate to be processed is not limited to a semiconductor wafer. For instance, a pattern transfer mask in lithography, a disc-shaped recording medium, etc. may be included. Furthermore, the processing performed on the substrate is not limited to sputter film formation. Such processes as sputter etching, CDE (chemical dry etching), CVD (chemical vapor deposition), and surface modification may be included.

EXPLANATION OF REFERENCE 10 holding member
11 tray
12 mask support
13 wafer support
14 recess
21 mask
30 processing chamber
32 rotary stage
32a electrostatic adsorption surface
32b tray mounting portion
34 target

What is claimed is:

1. A substrate processing apparatus comprising:
a ring-shaped tray including a substrate support configured to support an outer edge portion of a substrate, a mask support provided on an outer periphery side of the substrate support and projected above the substrate support, and a recess provided between the substrate support and the mask support;
a ring-shaped mask covering the recess and the substrate support of the tray with the mask being superposed on the mask support of the tray; and
a rotary stage including an electrostatic adsorption surface and a tray mounting portion provided on an outer periphery side of the electrostatic adsorption surface and below the electrostatic adsorption surface,
the outer edge portion of the substrate being projected toward the tray mounting portion side from the electrostatic adsorption surface, the substrate support being spaced below the outer edge portion of the substrate and the mask being spaced above the outer edge portion of the substrate with the substrate being adsorbed onto the electrostatic adsorption surface and the tray being mounted on the tray mounting portion.

2. The substrate processing apparatus according to claim 1, wherein the recess is provided continuously throughout a periphery of the ring-shaped tray.

3. The substrate processing apparatus according to claim 1, wherein the tray mounting portion includes a restriction mechanism configured to restrict sliding motion of the tray during rotation of the rotary stage.

4. The substrate processing apparatus according to claim 1, further comprising:
a processing chamber enclosed by a chamber wall including a transfer port; and
a transfer robot transferring the substrate supported on the tray into and out of the processing chamber through the transfer port with the mask being spaced from the substrate and supported on the mask support of the tray.

5. The substrate processing apparatus according to claim 1, further comprising a lift mechanism configured to lift the tray and the mask supporting the substrate up and down above the rotary stage.

6. The substrate processing apparatus according to claim 1, wherein the substrate is processed on the rotary stage under a vacuum.

\* \* \* \* \*

UNITED STATES PATENT AND TRADEMARK OFFICE
CERTIFICATE OF CORRECTION

| | | |
|---|---|---|
| PATENT NO. | : 9,099,513 B2 | Page 1 of 1 |
| APPLICATION NO. | : 13/062740 | |
| DATED | : August 4, 2015 | |
| INVENTOR(S) | : Kimio Kogure | |

It is certified that error appears in the above-identified patent and that said Letters Patent is hereby corrected as shown below:

In the specification, column 7, lines 53-54, please add -- 11 -- between "the tray" and "and the"

Signed and Sealed this
Ninth Day of February, 2016

Michelle K. Lee
*Director of the United States Patent and Trademark Office*